United States Patent
Raj et al.

(10) Patent No.: US 8,970,036 B2
(45) Date of Patent: Mar. 3, 2015

(54) STRESS RELIEVING SECOND LEVEL INTERCONNECT STRUCTURES AND METHODS OF MAKING THE SAME

(75) Inventors: Pulugurtha Markondeya Raj, Tucker, GA (US); Nitesh Kumbhat, Atlanta, GA (US); Venkatesh V. Sundaram, Alpharetta, GA (US); Rao R. Tummala, Greensboro, GA (US); Xian Qin, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 13/825,815

(22) PCT Filed: Sep. 20, 2011

(86) PCT No.: PCT/US2011/052384
§ 371 (c)(1),
(2), (4) Date: Jul. 3, 2013

(87) PCT Pub. No.: WO2012/047506
PCT Pub. Date: Apr. 12, 2012

(65) Prior Publication Data
US 2013/0270695 A1    Oct. 17, 2013

Related U.S. Application Data

(60) Provisional application No. 61/387,120, filed on Sep. 28, 2010, provisional application No. 61/509,209, filed on Jul. 19, 2011.

(51) Int. Cl.
*H01L 23/48* (2006.01)
*H01L 23/00* (2006.01)
*H05K 3/34* (2006.01)
*H05K 3/40* (2006.01)
*H05K 1/02* (2006.01)

(52) U.S. Cl.
CPC .............. *H01L 24/16* (2013.01); *H05K 3/3436* (2013.01); *H05K 3/4007* (2013.01); *H01L 24/11* (2013.01); *H05K 1/0271* (2013.01)
USPC ........... 257/737; 257/738; 257/778; 257/683; 257/780; 257/783

(58) Field of Classification Search
USPC .................. 257/737, 738, 778, 683, 780, 783
See application file for complete search history.

(56) References Cited

U.S. PATENT DOCUMENTS

| | | | |
|---|---|---|---|
| 5,783,465 A | 7/1998 | Canning et al. | |
| 5,851,853 A * | 12/1998 | Lee et al. | 438/108 |
| 6,190,940 B1 | 2/2001 | DeFelice et al. | |
| 7,087,458 B2 * | 8/2006 | Wang et al. | 438/108 |
| 7,335,995 B2 * | 2/2008 | Pflughaupt et al. | 257/779 |

(Continued)

FOREIGN PATENT DOCUMENTS

WO    2009061282 A1    5/2009

OTHER PUBLICATIONS

International Search Report and Written opinion dated Jan. 20, 2012.

*Primary Examiner* — Alexander Oscar Williams
(74) *Attorney, Agent, or Firm* — Troutman Sanders LLP; Ryan A. Schneider; Elizabeth-Ann Weeks

(57) ABSTRACT

Provided is a stress-relieving, second-level interconnect structure that is low-cost and accommodates thermal coefficient of expansion (TCE) mismatch between low-TCE packages and printed circuit boards (PCBs). The interconnect structure comprises at least a first pad, a supporting pillar, and a solder bump, wherein the first pad and supporting pillar are operative to absorb substantially all plastic strain, thereby enhancing compliance between the two electronic components.

7 Claims, 6 Drawing Sheets

(56) References Cited

U.S. PATENT DOCUMENTS 8,304,339 B2 * 11/2012 Lin ................................ 438/613
2003/0210531 A1 * 11/2003 Alcoe et al. ................... 361/728
2007/0228549 A1 10/2007 Hsu et al.
2010/0283122 A1 * 11/2010 Pulugurtha et al. ........... 257/532

* cited by examiner

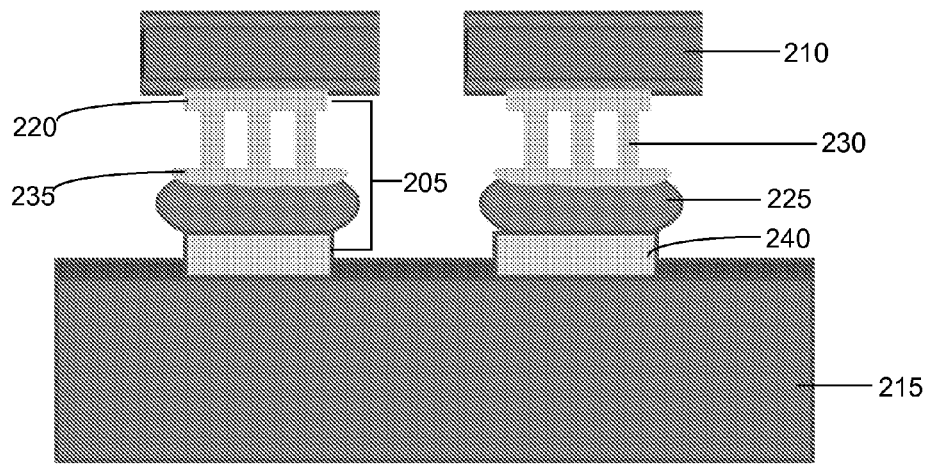
Figure 3
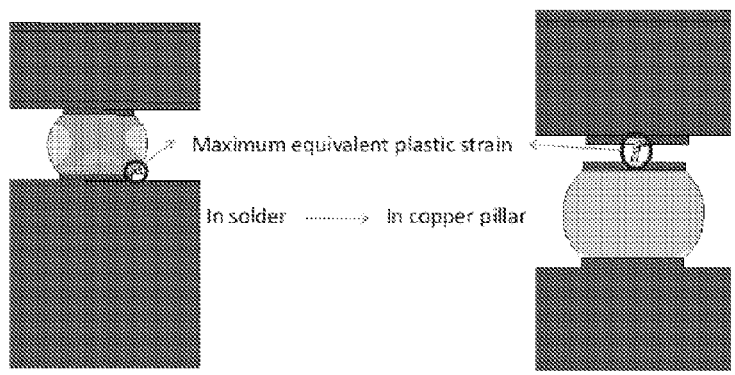
Figure 4
| Copper pillar geometry (diameter, height)/μm | Accumulated equivalent plastic strain in solder connection after 6 thermal cycles |
|---|---|
| Reference: solder bump interconnection without copper pillar | 0.091371 |
| 10-20 | 0.087842 (3.9% improvement) |
| 10-25 | 0.077991 (14.6% improvement) |
| 10-30 | 0.070217 (23.2% improvement) |
Figure 5

STRESS RELIEVING SECOND LEVEL INTERCONNECT STRUCTURES AND METHODS OF MAKING THE SAME

CROSS-REFERENCE TO RELATED APPLICATIONS

This application claims the benefit of International Patent Application Serial No. PCT/US2011/052384, filed 20 Sep. 2011, which claims the benefit of U.S. Provisional Patent Application Ser. No. 61/387,120, filed 28 Sep. 2010, and U.S. Provisional Patent Application Ser. No. 61/509,209, filed 19 Jul. 2011, which are incorporated herein by reference in their entirety as if fully set forth below.

BACKGROUND

1. Field

The various embodiments of the present invention relate to second-level interconnect structures, wherein features of the interconnect structure may be altered to achieve desired fine-pitch and low-stress properties, and to methods of making and using the same.

2. Description of Related Art

Interconnects facilitate electrical communication between various electronic components within an electronic system. A "first-level" interconnect, for example, facilitates electrical communication between integrated circuits ("ICs") and package leadframes. A "second-level" interconnect, for example, facilitates electrical communication between packages and printed circuit boards ("PCBs").

As the semiconductor industry migrates from two-dimensional ICs to three-dimensional ICs, new second-level interconnect structures that achieve higher electrical performance and successfully integrate heterogeneous ICs are needed. Specifically, new packaging techniques that are cost-effective, thermo-mechanically reliable, and provide compliant and reworkable second-level interconnections from large-body, low thermal coefficient of expansion ("TCE") packages to PCBs at fine pitches are desirable.

Several second-level interconnect structures are currently used, for example, land grid array ("LGA") packages, which are assembled onto a socket with flexible pins that contact lands on the package. These sockets are typically assembled onto a PCB with the help of solders. The package is then plugged into the sockets, therefore making it removable and reworkable for processor upgrades. An alternative structure is a solder based assembly that does not require an underfill.

These interconnect structures, however, face fundamental challenges as the trend towards three-dimensional ICs and silicon and glass-based low-TCE interposer packages with fine-pitch board level assembly gains momentum. First, providing a means for stress-relief within the current interconnect structures can be costly. Lower cost options, however, tend to induce tremendous TCE mismatch between low-TCE packages and PCBs. Second, this mismatch subsequently creates fundamental limitations in scaling down the pitch size with traditional solder compositions. Third, current underfill requirements prevent reworkability.

Alternative second-level interconnect structures are thus desirable that address these fundamental limitations and enhance thermo-mechanical reliability without compromising cost, reworkability, or electrical performance.

BRIEF SUMMARY

Exemplary embodiments of the present invention provide interconnect structures interposed between two electronic components, wherein substantially all plastic strain incurred by the interconnect structure is absorbed by a supporting pillar.

In exemplary embodiments, the interconnect structure comprises a first pad, a second pad opposite the first pad, at least one supporting pillar disposed between the first pad and second pad, and a solder bump having a top surface and a bottom surface, wherein the second pad is disposed on the top surface of the solder bump.

The interconnect structure can further comprise a plurality of supporting pillars disposed between the first and second pads. A polymer composite, for example but not limited to, a low-modulus polymer can be disposed between the plurality of supporting pillars.

In some embodiments, the at least one supporting pillar can be a copper-coated polymer.

In some embodiments, the second pad is of a size sufficient to prevent wicking of the solder bump.

In some embodiments, the first and second pads can be made of copper and can be about 15 micrometers thick.

In some embodiments, the at least one supporting pillar can be made of copper, can have a diameter of about 5 to 15 micrometers, and can have a length of about 10 to 50 micrometers. The at least one supporting pillar can have a diameter to length ratio of about 1:2 to about 1:10.

In some embodiments, the solder bump can be tin, silver, copper, lead, or a combination thereof.

In another exemplary embodiment, the interconnect structure comprises a first pad adjacent a first electronic component, a solder bump having a top surface and a bottom surface, a second pad disposed on the top surface of the solder bump, at least one supporting pillar disposed between the first pad the second pad, and a third pad disposed on the bottom surface of the solder bump such that the third pad is adjacent the second electronic component.

The interconnect structure can further comprise a plurality of supporting pillars disposed between the first and second pads. A polymer composite, for example but not limited to, a low-modulus polymer can be disposed between the plurality of supporting pillars.

In yet another exemplary embodiment, the interconnect structure comprises a first pad, a solder bump having a top surface and a bottom surface, and at least one supporting pillar disposed between the first pad and the solder bump, wherein the at least one supporting pillar penetrates the top surface of the solder bump.

The interconnect structure can further comprise a plurality of supporting pillars disposed between the first pad and solder bump. Further, the at least one supporting pillar can be a copper-coated polymer.

Exemplary embodiments of the present invention also provide a method of making the interconnect structure, comprising forming at least one first pad on a first package substrate, depositing a photoresist around the at least one first pad, plating at least one supporting pillar adjacent the at least one first pad and plating at least one second pad adjacent the at least one supporting pillar in one simultaneous step, plating a solder bump adjacent the at least one second pad, and removing the photoresist.

The method can further comprise patterning at least one third pad on a PCB and assembling the interconnect structure such that the solder bump is placed adjacent the at least one third pad. Plating the at least one supporting pillar, the at least one second pad, and the solder bump can occur simultaneously in one step.

FIGURES

FIG. 3 illustrates yet another second-level interconnect structure interposed between two electrical components, in accordance with exemplary embodiments of the present invention.

FIG. 4 illustrates plastic strain distribution in an exemplary embodiment of the second-level interconnect structure as compared to the prior art.

FIG. 5 illustrates the affect a diameter to height aspect ratio of a supporting pillar has on the plastic strain applied to a solder bump.

DETAILED DESCRIPTION

Figure 2:
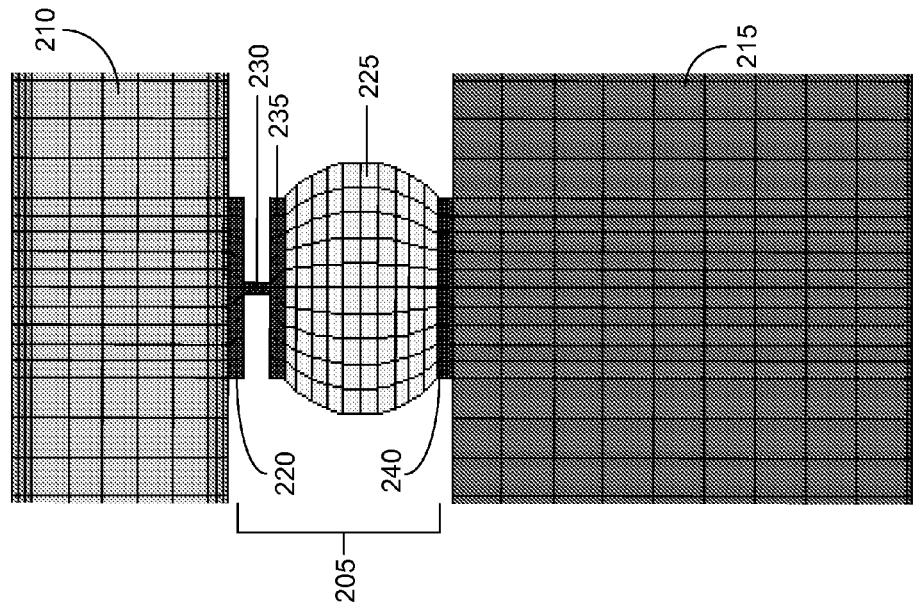
FIG. 2 illustrates another second-level interconnect structure interposed between two electrical components, in accordance with exemplary embodiments of the present invention.

Referring now to the figures, wherein like reference numerals represent like parts throughout the several views, exemplary embodiments of the present invention will be described in detail. Throughout this description, various components can be identified as having specific values or parameters, however, these items are provided as exemplary embodiments. Indeed, the exemplary embodiments do not limit the various aspects and concepts of the present invention as many comparable parameters, sizes, ranges, and/or values can be implemented.

It should also be noted that, as used in the specification and the appended claims, the singular forms "a," "an," and "the" include plural references unless the context clearly dictates otherwise. For example, reference to a component is intended also to include composition of a plurality of components. References to a composition containing "a" constituent is intended to include other constituents in addition to the one named. Also, in describing the preferred embodiments, terminology will be resorted to for the sake of clarity. It is intended that each term contemplates its broadest meaning as understood by those skilled in the art and includes all technical equivalents which operate in a similar manner to accomplish a similar purpose.

Values may be expressed herein as "about" or "approximately" one particular value, this is meant to encompass the one particular value and other values that are relatively close but not exactly equal to the one particular value. By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a composition does not preclude the presence of additional components than those expressly identified.

As used herein, the terms "interconnect" and "interconnect structure" may used interchangeably and refer to devices that can be used for connecting electronic components across one or more of the generally accepted six levels of interconnection in an electronic system. Further, the term printed wiring board ("PWB") and printed circuit boards ("PCBs") may be used interchangeably. It shall also be understood that the term "adjacent" can mean, for example, below, above, and/or next to.

The various embodiments of the present invention provide a stress-relieving, second-level interconnect structure that is low-cost and accommodates TCE mismatch between low-TCE packages and PCBs. The various embodiments of the interconnect structure are reworkable and can be scaled to pitches from about 1 millimeter (mm) to about 150 micrometers (μm).

The versatility, scalability, and stress-relieving characteristics of the interconnect structure of the present invention make it a desirable structure to utilize in current two-dimensional and ever-evolving three-dimensional IC structures.

Figure 1:
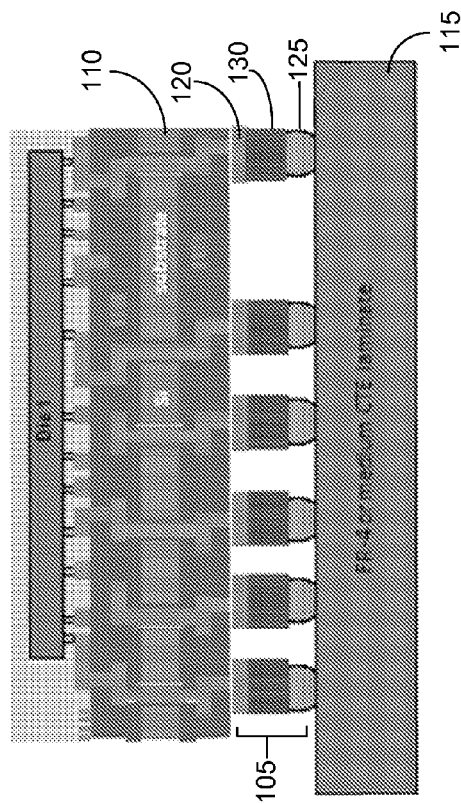
FIG. 1 illustrates a second-level interconnect structure interposed between two electrical components, in accordance with exemplary embodiments of the present invention.

Referring to FIGS. 1, 2, and 3, exemplary embodiments of interconnect structures are illustrated. The various interconnect structure embodiments are disposed between two electronic components, and more specifically, a low-TCE package and a PCB. As illustrated, there is at least one interconnect structure disposed between the two electronic components, however it shall be understood that a plurality of interconnect structures can be disposed between the two electronic components. It shall also be understood that while the various interconnect structure embodiments are slightly different, they all comprise at least a first pad, a supporting pillar, and a solder bump, wherein the first pad and supporting pillar are operative to absorb substantially all plastic strain, therefore enhancing compliance.

The interconnect structure 105 illustrated in FIG. 1 comprises a first pad 120, a solder bump 125 having a top surface and a bottom surface, and at least one supporting pillar 130 disposed between the first pad 120 and the top surface of the solder bump 125. The first pad 120 and the supporting pillar 130 can be made of many electrically conductive materials to facilitate electrical conductivity between the two electronic components 110/115, for example but not limited to, copper, aluminum, or combinations thereof. A polymer, for example, a low-modulus polymer, such as polyimides and silicones, can be disposed around the supporting pillar 130 to provide further support to the supporting pillar 130. The supporting pillar 130 can also be a metal-coated polymer, wherein the inside comprises the polymer and the outside comprises copper, aluminum, or combinations thereof. It shall be understood that the supporting pillar 130 is of adequate thickness to handle the appropriate electrical current running between the two electronic components 110/115. In some embodiments, one supporting pillar 130 may be disposed between the first pad 120 and the solder bump 125. In other embodiments, however, a plurality of supporting pillars 130 may be disposed between the first pad 120 and the solder bump 125. In this embodiment, the polymer material can be disposed between the plurality of supporting pillars 130 to provide further structural support.

The solder bump 125 can be substantially spherical in shape and can be made from materials such as, tin, silver, copper, lead, or combinations thereof. It shall be understood that the first pad 120 and the supporting pillar 130 materials must be of a melting point higher than the solder bump 125 material so that melting the solder does not subsequently melt the first pad 120 and supporting pillar 130. In some embodiments, the supporting pillar(s) 130 can penetrate the top surface of the solder bump 125. When the interconnect structure 105 and the two electronic components 110/115 are compressed together and combined, the first pad 120 and supporting pillar 130 act to absorb substantially all plastic strain applied to the interconnect structure 105 due to thermal or mechanical or thermo-mechanical loading during its testing and operation. Thus, the solder bump 125 receives minimal stress and the reliability and durability of the interconnect structure becomes enhanced.

Referring to FIG. 2, there is shown an illustration of another exemplary embodiment of an interconnect structure 205 disposed between two electronic components 210/215. This interconnect structure 205 embodiment comprises a first pad 220, a second pad 235 opposite the first pad 220, and a supporting pillar 230 disposed therebetween. The interconnect structure 205 further comprises a solder bump 225 having a top surface and a bottom surface, wherein the second pad 235 is disposed on the top surface of the solder bump 225, and further wherein a third pad 240 can be disposed on the bottom surface of the solder bump 225.

As described above, the first pad 220, second pad 235, and third pad 240 can be made of copper, aluminum, or combinations thereof. It shall be understood that although this embodiment provides three pads, the various interconnect structure embodiments can have variations thereof (for example, a first and third pad, a first and second pad, a second and third pad, etc.). The supporting pillar 230 can also be made of copper, aluminum, or combinations thereof. As illustrated in FIG. 2, one supporting pillar 230 can be disposed between the first pad 220 and second pad 235. In an alternative embodiment, and as illustrated in FIG. 3, a plurality of supporting pillars 230 can be disposed between the first pad 220 and second pad 235. The supporting pillars 230 can be further structurally supported by a low-modulus polymer, however the low-modulus polymer is not required.

The solder bump 225 can be substantially spherical in shape and can be made from materials such as, tin, silver, copper, lead, or combinations thereof. When the interconnect structure 205 and the two electronic components 210/215 are compressed together and combined, the first pad 220, second pad 235, third pad 240, and supporting pillar 230 act to absorb substantially all plastic strain applied to the interconnect structure 205 due to thermal or mechanical or thermo-mechanical loading during its testing and operation. Thus, the solder bump 225 receives minimal plastic strain and the reliability and durability of the interconnect structure become enhanced.

It shall be understood that the elements described in the various exemplary embodiments can be interchanged and/or combined to create other embodiments, and thus the examples provided herein are in no way limiting.

The various interconnect structure embodiments can be tuned to achieve a desired pitch size, for example, from about 1 millimeter (mm) to about 150 micrometers (μm), therefore making the exemplary embodiments of the interconnect structure desirable for three-dimensional interposer applications. Specifically, the first, second, and third pads can range from about 10 micrometers to about 15 micrometers in thickness. Further, the supporting pillar(s) can be of a diameter ranging from about 5 micrometers to about 15 micrometers and of a length ranging from about 10 micrometers to about 50 micrometers. In exemplary embodiments, the supporting pillar 230 has a diameter to length aspect ratio of about 1:2 to about 1:10.

As described, the supporting pillar of the various embodiments can accommodate part of the TCE mismatch between package and board. Without the supporting pillars, the maximum equivalent plastic strain caused by deformation is applied to the solder bumps. However, in the exemplary embodiments described herein, the maximum equivalent plastic strain is applied to the supporting pillar, while the strain applied to the solder bump is minimal, as illustrated in FIG. 4. It shall be understood that the diameter to height aspect ratio of the supporting pillar directly influences the plastic strain applied to the solder bump. It shall be further understood that a higher aspect ratio consequently lowers the plastic strain applied to the solder bump, as demonstrated in FIG. 5. The feasibility of fabrication, however, must also be considered in determining an optimal aspect ratio.

Figure 6:
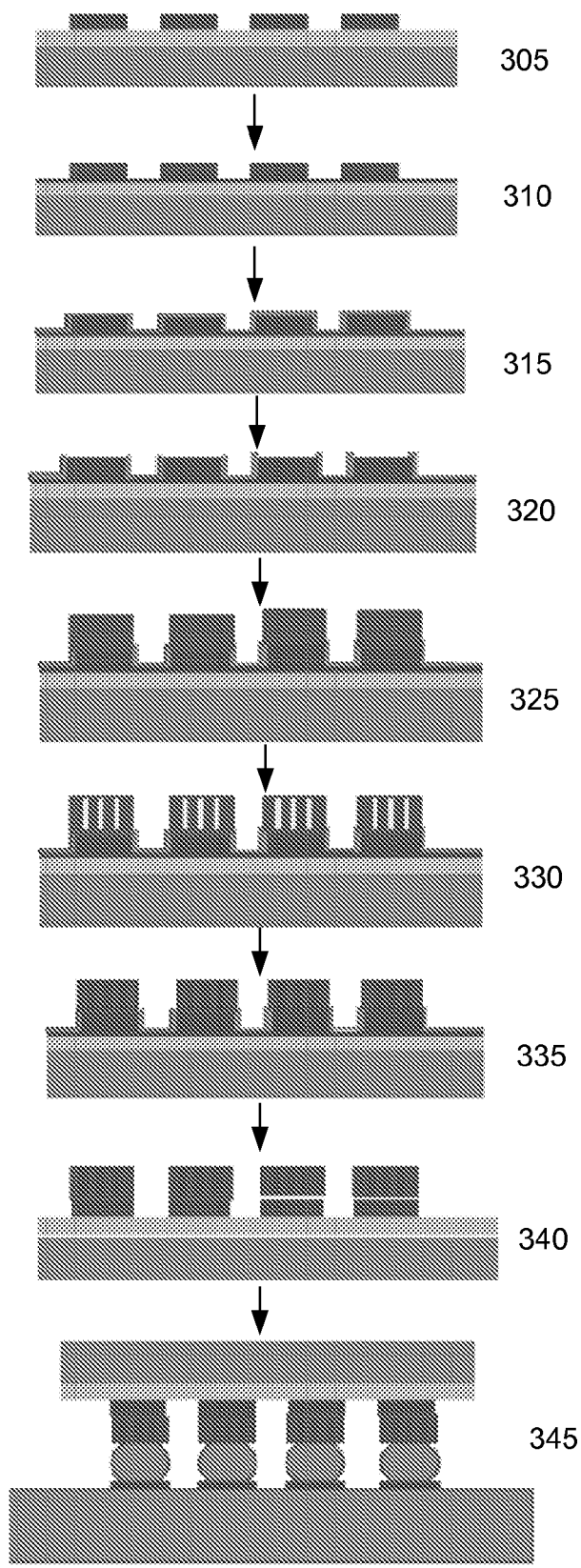
FIG. 6 illustrates a method of manufacturing the second-level interconnect structure of FIG. 1, in accordance with exemplary embodiments of the present invention.
Figure 7:
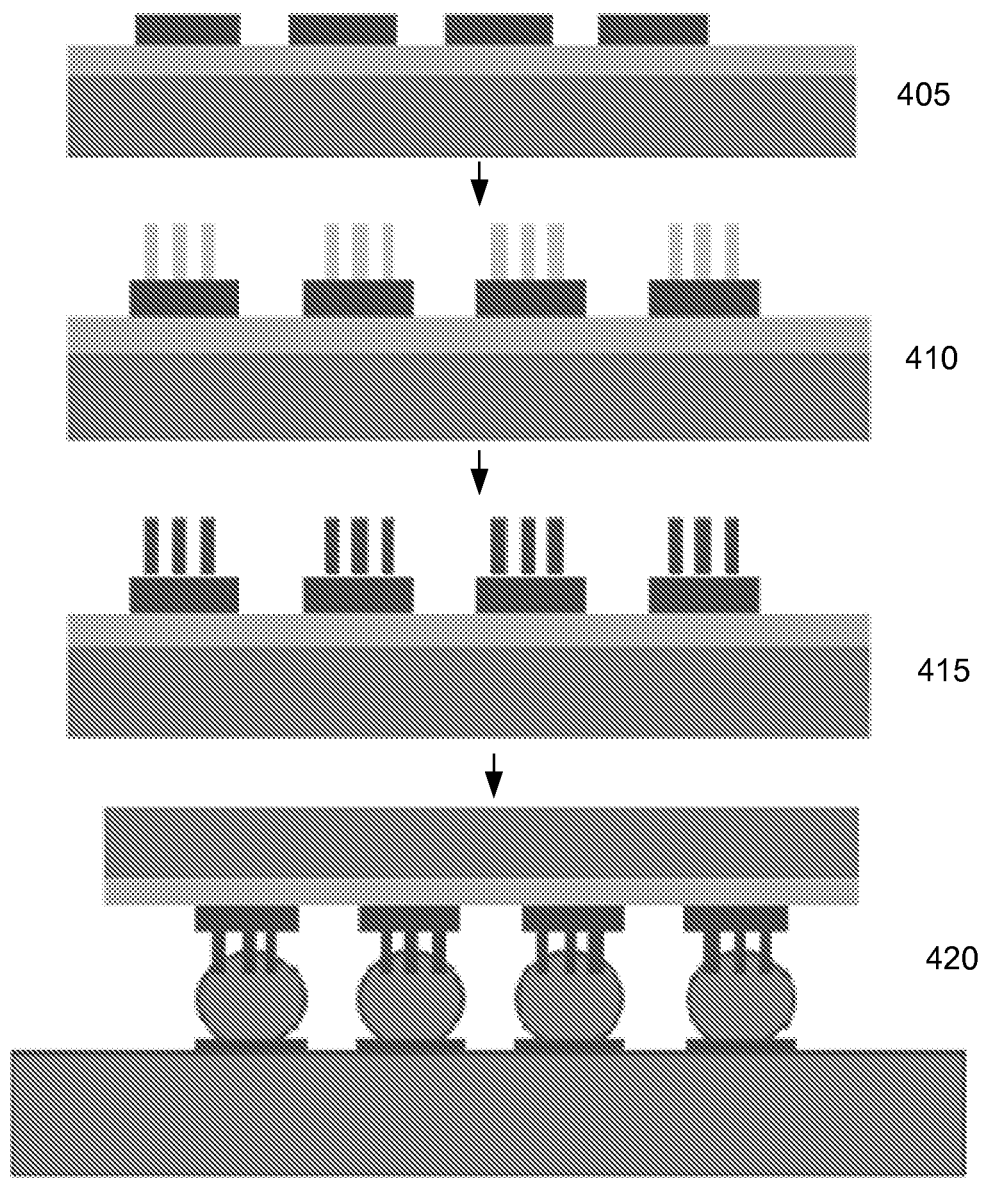
FIG. 7 illustrates another method of manufacturing the second-level interconnect structure of FIG. 1, in accordance with exemplary embodiments of the present invention.

The interconnect structure 105 illustrated in FIG. 1 can be fabricated using either an electroplating method, an electroless plating method, or combinations thereof, as illustrated in FIGS. 6 and 7. FIG. 6 illustrates process steps for fabricating an interconnect structure comprising at least one supporting pillar made of copper, aluminum, or combinations thereof. As described above, the supporting pillar can optionally be supported with a polymeric material. The first step includes providing an interposer with at least one first pad 305. A seed layer can then be deposited on the interposer 310. A plating-mask layer can subsequently be deposited over the seed layer and first pads 315. The plating mask layer can then be removed from the surface of the first pads 320 and the low-modulus polymer, if used, can then be deposited over the first pads 325. At least one via is then defined within the low-modulus polymer 330. Vias can then be coated with copper, aluminum, and/or combinations thereof to define the supporting pillar(s) 235. The mask and seed layer may then be removed 340. The interposer, first pad, and supporting pillar(s) may subsequently be assembled on a solder bump disposed on a PCB substrate 345.

Referring to FIG. 7, there is shown process steps for fabricating an interconnect structure comprising at least one supporting pillar, wherein the at least one supporting pillar is a metal-coated polymer. As explained above, the polymer can be coated with copper, aluminum, or combinations thereof. In this example, the first step also includes providing an interposer with at least one first pad 405. At least one polymer wire may be formed on the first pads by injection molding, transfer, and printing 410. The polymer wire can then be electroless plated with copper, aluminum, and/or combinations thereof to create a metal-coated polymer supporting pillar 415. The interposer, first pad, and supporting pillar may then be assembled on a solder bump disposed on a substrate 420.

Figure 8A:
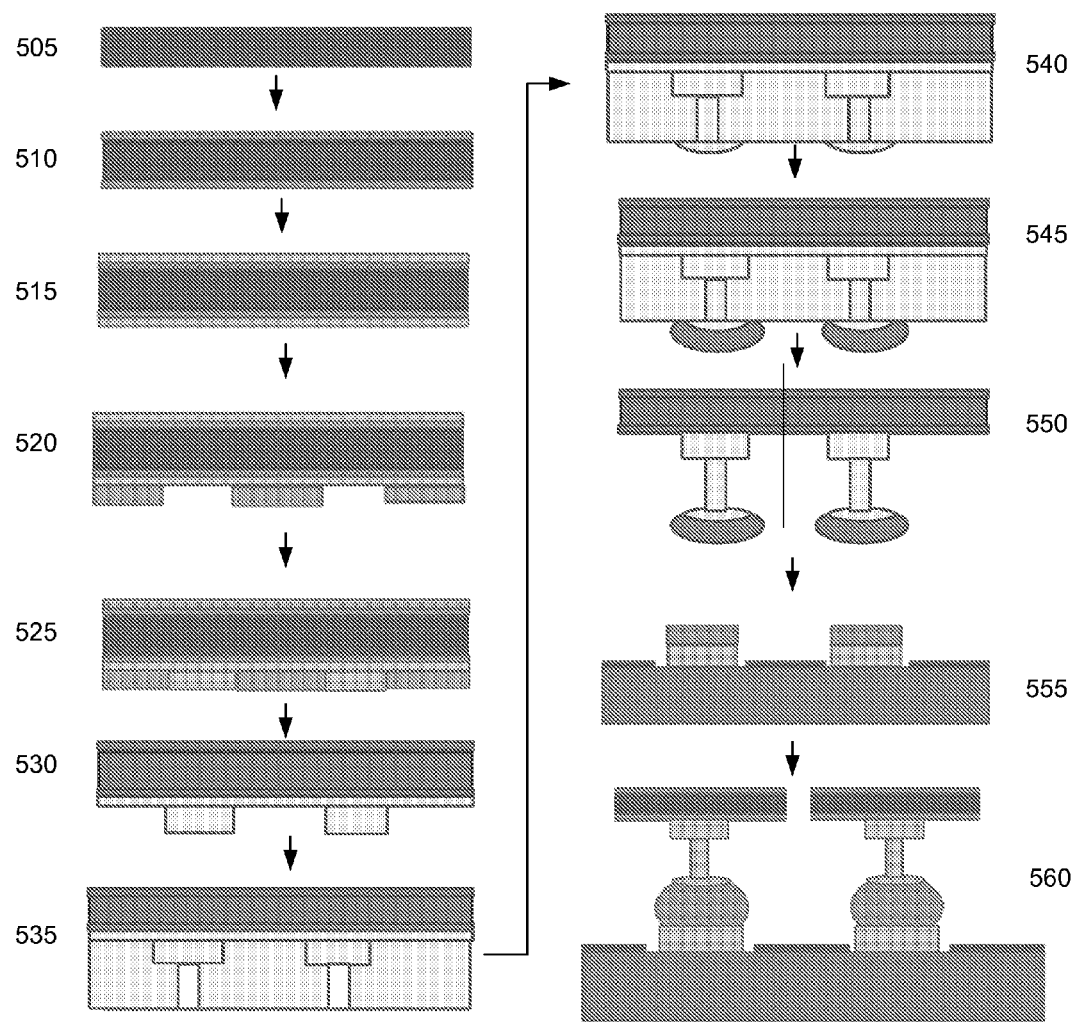
FIGS. 8A and 8B illustrates methods of manufacturing the second-level interconnect structure of FIG. 2 and FIG. 3, respectively, in accordance with exemplary embodiments of the present invention.
Figure 8B:
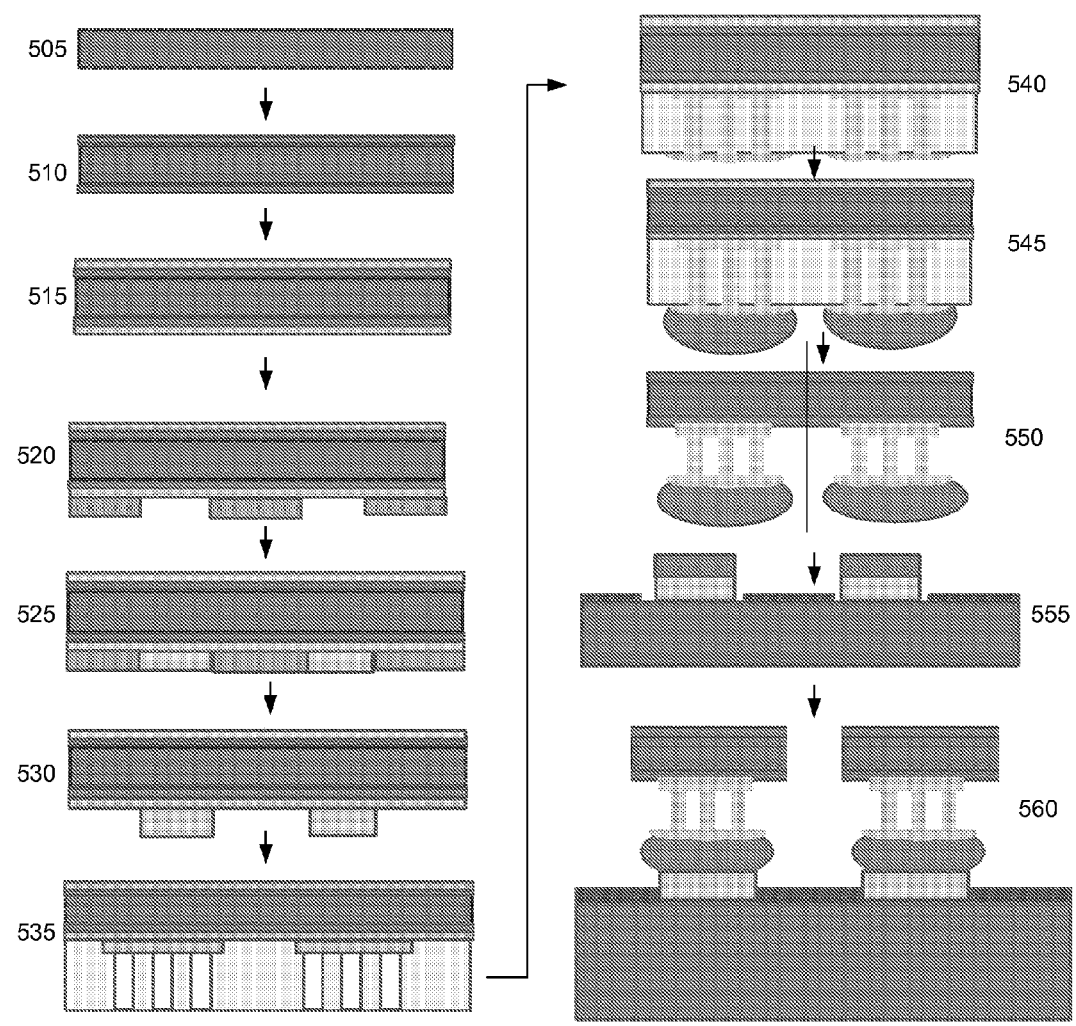

The interconnect structures illustrated in FIGS. 2 and 3 can also be manufactured using electroless plating techniques, electroplating techniques, or combinations thereof, as illustrated in FIGS. 8a and 8b, respectively. As illustrated, the package substrate is first cleaned 505. A stress buffer layer can then be laminated on both sides of the package substrate 510. An electroless copper seed layer about 0.3 to about 0.5 micrometers thick can subsequently be deposited on the stress buffer layer 515. Using photolithographic techniques 520, electrolytic copper plating techniques 525, and photoresist stripping techniques 530, at least one first pad can be formed. A liquid or dry film photoresist can then be deposited around the at least one first pad and channels can be defined using lithography techniques 535.

Copper can then be plated within the channels to form the at least one supporting pillar and the at least one second pad in one simultaneous step 540. The ability to electroplate both the supporting pillar and the second pad in one step is an improvement over conventional two-step methods. By electroplating the supporting pillar and the second pad in one simultaneous step, the size of the second pad may be limited, as illustrated in FIG. 8a. However, as illustrated in FIG. 8b, the size of the second pad may be increased by fabricating a plurality of supporting pillars. As one skilled in the art will appreciate, an increased second pad size better contains the solder bump and prevents the solder bump from wicking up and interfering with the supporting pillars. Alternatively, the supporting pillars and the second pad can be fabricated in separate steps to increase the size of the second pad. Solder bumps can then be plated adjacent each of the at least one second pads 545. It shall be understood, that the solder bumps may also be plated simultaneously with the supporting pillars and second pad plating, such that the plating of the supporting pillars, second pad, and solder bump all occur in one step. The photoresist and the seed layer can then be stripped and the package substrate can be diced 550 accordingly. Finally, at least one third pad can be patterned on a PCB 555 and the package substrate to PCB can be assembled 560.

Numerous characteristics and advantages have been set forth in the foregoing description, together with details of structure and function. While the invention has been disclosed in several forms, it will be apparent to those skilled in the art that many modifications, additions, and deletions, especially in matters of shape, size, and arrangement of parts, can be made therein without departing from the spirit and scope of the invention and its equivalents as set forth in the following claims. Therefore, other modifications or embodiments as may be suggested by the teachings herein are particularly reserved as they fall within the breadth and scope of the claims here appended.

We claim:

1. A system of interconnected electronic devices the system comprising:
    a first electronic component;
    a second electronic component; and
    an interconnect structure interposed between the first and second electronic components, wherein the interconnect structure comprises:
        a first pad adjacent the first electronic component;
        a solder bump having a top surface and a bottom surface;
        a plurality of supporting pillars disposed between the first pad and the top surface of the solder bump; and
        a second pad disposed on the bottom surface of the solder bump such that the second pad is adjacent the second electronic component.

2. The system of claim 1, further comprising a polymer composite disposed between the plurality of supporting pillars.

3. The system of claim 1, wherein substantially all plastic strain incurred by the interconnect structure is absorbed by the plurality of supporting pillars.

4. An interconnect structure interposed between two electronic components, comprising:
    a first pad;
    a solder bump having a top surface and a bottom surface; and
    a plurality of supporting pillars disposed between the first pad and solder bump, wherein each of the plurality of supporting pillars penetrates the top surface of the solder bump.

5. The interconnect structure of claim 4, wherein each of the plurality of supporting pillars comprises a copper-coated polymer.

6. The system of claim 1, wherein the interconnect structure further comprises a third pad disposed on the top surface of the solder bump, wherein the plurality of supporting pillars is disposed between the first and third pads.

7. The system of claim 1, wherein the first electronic component comprises a low-thermal expansion coefficient package and the second electronic component comprises a printed circuit board.

* * * * *